United States Patent [19]
Murphy

[11] Patent Number: 5,844,451
[45] Date of Patent: Dec. 1, 1998

[54] CIRCUIT ELEMENT HAVING AT LEAST TWO PHYSICALLY SEPARATED COIL-LAYERS

[76] Inventor: Michael T. Murphy, 38 Rangers Dr., Hudson, N.H. 03051

[21] Appl. No.: 201,623

[22] Filed: Feb. 25, 1994

[51] Int. Cl.$^6$ ..................................................... H03H 7/09
[52] U.S. Cl. ............................................ 333/185; 336/200
[58] Field of Search .................................... 333/185, 175, 333/245; 336/200

[56] References Cited

U.S. PATENT DOCUMENTS

| | | | |
|---|---|---|---|
| 1,647,474 | 11/1927 | Seymour | 333/185 X |
| 4,342,143 | 8/1982 | Jennings | 29/25.42 |
| 4,591,814 | 5/1986 | Ito et al. | 333/185 X |
| 4,614,925 | 9/1986 | Kane | 333/185 X |
| 4,754,242 | 6/1988 | Okamura et al. | 333/175 |
| 5,032,810 | 7/1991 | Kaneko et al. | 333/185 |
| 5,105,172 | 4/1992 | Khatibzadeh et al. | 333/185 X |
| 5,231,078 | 7/1993 | Riebman et al. | 333/185 X |
| 5,283,462 | 2/1994 | Stengel | 333/185 X |

FOREIGN PATENT DOCUMENTS

| | | | |
|---|---|---|---|
| 159510 | 7/1987 | Japan | 333/185 |
| 4030615 | 2/1992 | Japan | 333/185 |

*Primary Examiner*—Benny Lee

[57] ABSTRACT

A novel circuit element is provided which exhibits the characteristics of a conventional series-connected capacitor-inductor network, but consumes only about half the surface area required by the conventional network. Particular utility of the present invention is found in the area of impedance matching in monolithic microwave integrated circuits, although other utilities are contemplated, such as, e.g. in other integrated circuit applications.

34 Claims, 8 Drawing Sheets

CIRCUIT ELEMENT HAVING AT LEAST TWO PHYSICALLY SEPARATED COIL-LAYERS

BACKGROUND OF THE INVENTION

1. Field of the Invention

The present invention relates generally to integrated circuits and, more particularly to integrated circuit elements which exhibit the characteristics of conventional series-connected capacitor-inductor networks but which require or consume only about half of the surface area required by the conventional networks. Particular utility for the present invention is found in the area of impedance matching in monolithic microwave application circuitry, and will be described in connection with such utility, although other utilities contemplated.

2. Description of Pertinent Art

As seen in FIG. 1, monolithic microwave integrated circuits typically comprise two or more distinct networks N1, N2 which are coupled together to form an overall integrated circuit 1. In such circuits, it is desirable that as much AC microwave energy as possible from one network N1 be transmitted to the other network N2, and that as little DC biasing current be transmitted from network N1 to network N2 (i.e., that networks N1 and N2 should be decoupled from each other with respect to DC). In order for this desirable condition to occur, the input and output impedances of the networks N1, N2 must be carefully adjusted so that the input impedance of one network N1 is the complex conjugate of the output impedance of the network N2 to which it is coupled, and means must be provided for buffering the two networks N1, N2 so that flow of DC current between them is prevented. One common scheme for accomplishing this consists of connecting the two networks N1, N2 together via an impedance matching/DC-blocking network LC1, which consists of a series-connected capacitor C1 and inductor L1 whose characteristic capacitance and inductance, respectively, are carefully chosen to accomplish the foregoing objectives.

Unfortunately however, when actually realized in an integrated circuit, capacitor C1 and inductor L1 must be individually formed in the substrate. This means that capacitor-inductor network LC1 must consume a relatively large amount of on-chip surface area, thereby decreasing the amount of on-chip features that may be included in a given integrated circuit design. Thus, it would be desirable to reduce the amount of surface area consumed by network LC1 in order to facilitate greater on-chip circuit integration.

OBJECTS OF THE INVENTION

It is a general object of the present invention to provide a novel circuit element that overcomes the aforesaid and other disadvantages and drawbacks of the prior art, and more specifically, to provide a circuit element that exhibits the characteristics of a conventional series-connected capacitor-inductor network but consumes only about half the surface area required for the inductor of such a network.

SUMMARY OF THE INVENTION

The present invention provides a novel circuit element is provided which exhibits the electrical characteristics of a series-connected capacitor and inductor. One preferred embodiment of the present invention comprises two substantially identical coiled-layers of conductive material centered about a common axis. A layer of dielectric material is interposed between the two conductive layers. Input and output terminals are attached to the two coiled-layers. Also in this embodiment, the dimensions and number of turns of the coiled-layers, and the thickness of the dielectric layer are predetermined to permit the element to have equivalent series capacitance and inductance desired for same.

Advantageously, the circuit element of the present invention exhibits the characteristics of a conventional series-connected capacitor-inductor network, but consumes only about half of the surface area required by the conventional network.

Other features and advantages of the present invention will become apparent as the following Detailed Description and with reference to the Drawings, wherein like numerals depict like parts and in which:

While the present invention will hereinafter be described in connection with preferred embodiments and methods of use, it will be understood that it is not intended to limit the present invention to these embodiments or methods of use. On the contrary, it is intended to cover all alternatives, modifications, and equivalents as may be included within the spirit and broad scope of the present invention, as defined only by the hereinafter appended claims.

DETAILED DESCRIPTION OF PREFERRED EMBODIMENTS

Figure 2:
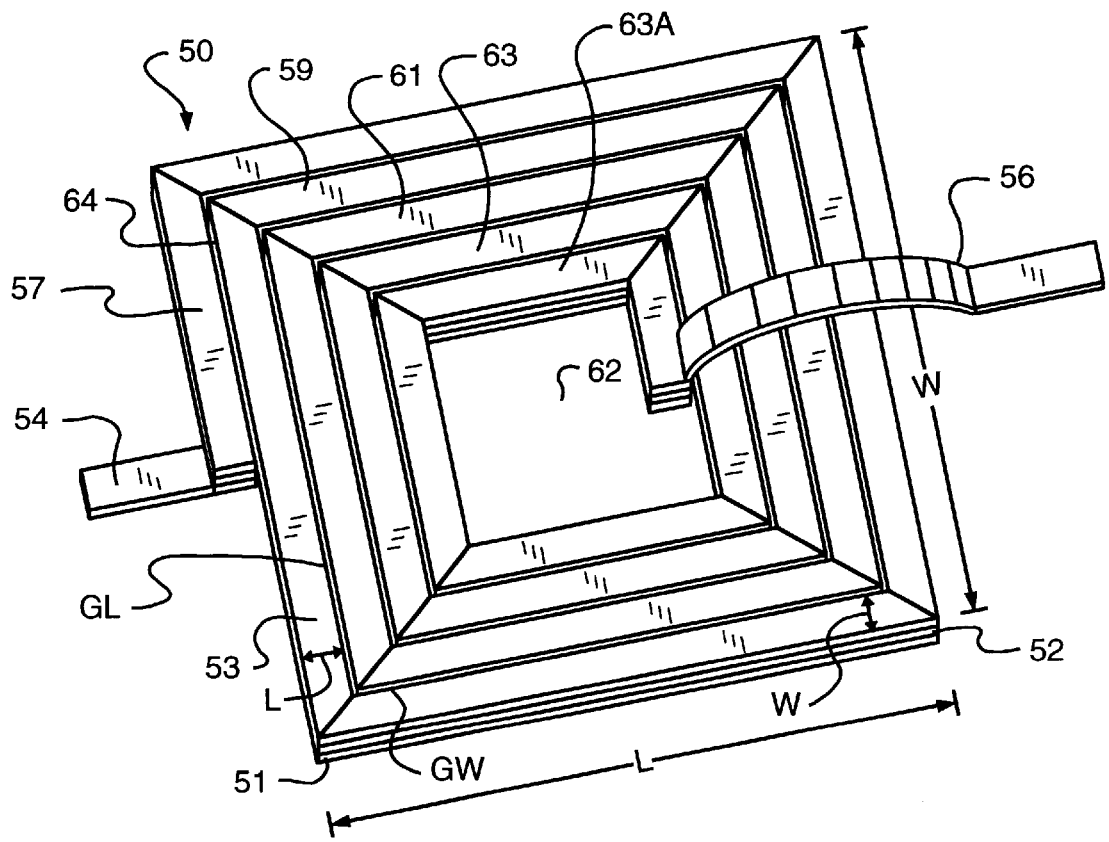
FIG. 2 is a top perspective view of the physical layout of one embodiment of the present invention.
Figure 2A:
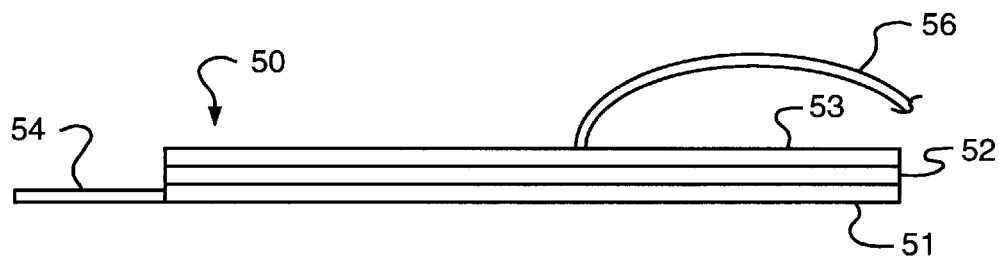
FIG. 2A is a simplified side view of the physical layout of the embodiment shown in FIG. 2.

FIGS. 2 and 2A are a top perspective view and side view, respectively, of one preferred embodiment 50 of the circuit element of the present invention (shown separated from its supporting substrate for purposes of discussion). Embodiment 50 comprises two superimposed layers 51, 53 of conductive material separated by a layer of dielectric material 52. In this embodiment, conductive layers 51, 53 are patterned, by conventional integrated circuit processing techniques well-known to those skilled in the art, to form two substantially identical rectilinear coils (defining gap spaces 64 as seen in FIG. 2) centered about a common imaginary centerpoint or axis 62 (see FIG. 2). Preferably, coiled-layers 51, 53 are from 0.5 to 5 microns thick, and more preferably from 1 to 3 microns thick. Depending upon the characteristics (e.g., the series capacitance and inductance) desired for element 50, coiled layers 51, 53 may be rectilinear in shape (as shown in FIG. 2), spiral-shaped, ovoid-shaped, or any other shape. Furthermore, layers 51, 53 need not be centered about a common axis 62 (and thus, precisely superimposed upon each other). Alternatively, layers 51, 53 may be centered about different respective axes (not shown). In this alternate configuration, coiled layers 51, 53 are displaced relative to each other by a predetermined distance, but still partially overlap each other, to adjust or fine-tune the series-capacitance of element 50. Preferably, in this alternative embodiment, the layers 51, 53 are made to overlap each other within the range of between 30 and 100 percent of their respective surface areas.

Also as shown in FIG. 2, in this embodiment, coiled layer 53 has four full-turns 57, 59, 61, 63 and one half-turn 63A. It should be understood that although only the turns 57, 59, 61, 63, 63A of coiled-layer 53 are shown in the drawings, in this embodiment, underlying coiled-layer 51 comprises turns corresponding to those of coiled-layer 53. The number of turns for each of the two layers 51, 53 may be the same, or may be independently varied, as needed, to achieve desired characteristics for element 50. Of course, the number of turns for each of the two layers 51 and 53 may be varied between a large number, but preferably will be between 2.5 and 6.5 turns.

Preferably, dielectric material layer 52 comprises silicon nitride, silicon dioxide, and/or other types of conventional insulating materials. The insulating material interposed between conducting layers 51, 53 preferably also fills gaps 64 defined by the turns of the conductive layers 51, 53 of element 50. Also, preferably, the thickness of interposed dielectric layer 52 is substantially uniform and is predetermined so as to enable element 50 to exhibit desired series capacitance and inductance.

Also, element 50 preferably comprises at least two terminals 54, 56 for connecting the element 50 e.g. other circuit elements (not shown). Preferably, each of the two conductive layers 51, 53 comprises its own respective terminal 54 and 56, respectively. As shown in FIG. 2, terminal 56 attached to half-turn 63A may be elevated (by, for example, use of conventional air-bridge technology) above the rest of element 50 so as to prevent short-circuiting of terminal 56 to the rest of element 50.

Preferably, in this embodiment as seen in FIG. 2, the physical dimensions of element 50 (i.e., its outer length L and width W, individual line lengths l and widths w, gap lengths GL and widths GW), and the thickness of the insulating layer 52, are selected to allow the element 50 to exhibit desired characteristics. For example, in order to construct an element that exhibits the characteristics of a 50 picofarad capacitor connected in series to a 5 nano Henry inductor, element 50 is made according to the following dimensions: L and W are made equal to 370 microns; l and w are made equal to 25 microns; and, GL and GW are made equal to 6 microns. Further preferably, the thickness of the interposed dielectric layer 52 is between about 1000 angstroms and 3000 angstroms, and more preferably, is about 1500 angstroms. Of course, these dimensions are merely exemplary and are variable, depending upon the characteristics desired for element 50.

Advantageously, it has been found that a circuit element made according to the present invention exhibits the characteristics of a conventional series-connected capacitor and inductor network, but consumes only about one half of the surface area required to realize the conventional network.

Figure 3:
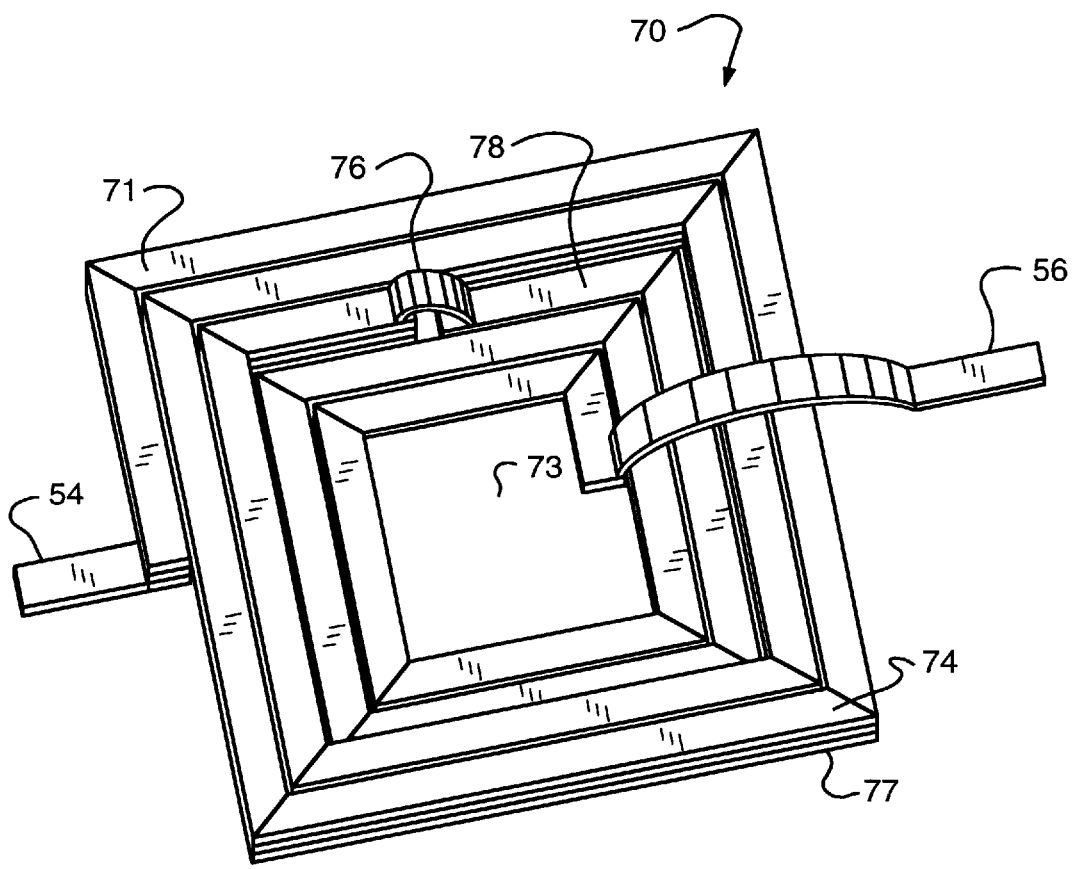
FIG. 3 is a top perspective view of the physical layout of another embodiment of the present invention.

Various modifications and variations of the present invention are possible without departing therefrom. For example, FIG. 3 illustrates a circuit 70 in which a conventional inductor coil 78 is located within a central portion 73 of element 71 made according to the present invention and is connected in series with circuit element 71 via conventional air-bridge connection lead or means 76. Element 71 is essentially identical to element 50 shown in FIGS. 2 and 2A, except that element 71 has fewer turns than element 50. As is shown in FIG. 3, inductor 78 is connected to upper conductor 74 of device 71, but alternatively, may be connected to lower conductor 77.

Advantageously, circuit 70 exhibits the characteristics of a conventional series network consisting of a capacitor and two inductors, but consumes only about the space required to realize the two conventional inductors. Thus, circuit 70 permits substantial reduction in the amount of on-chip surface area as compared to the prior art, without corresponding reduction in on-chip functionality.

Figure 4:
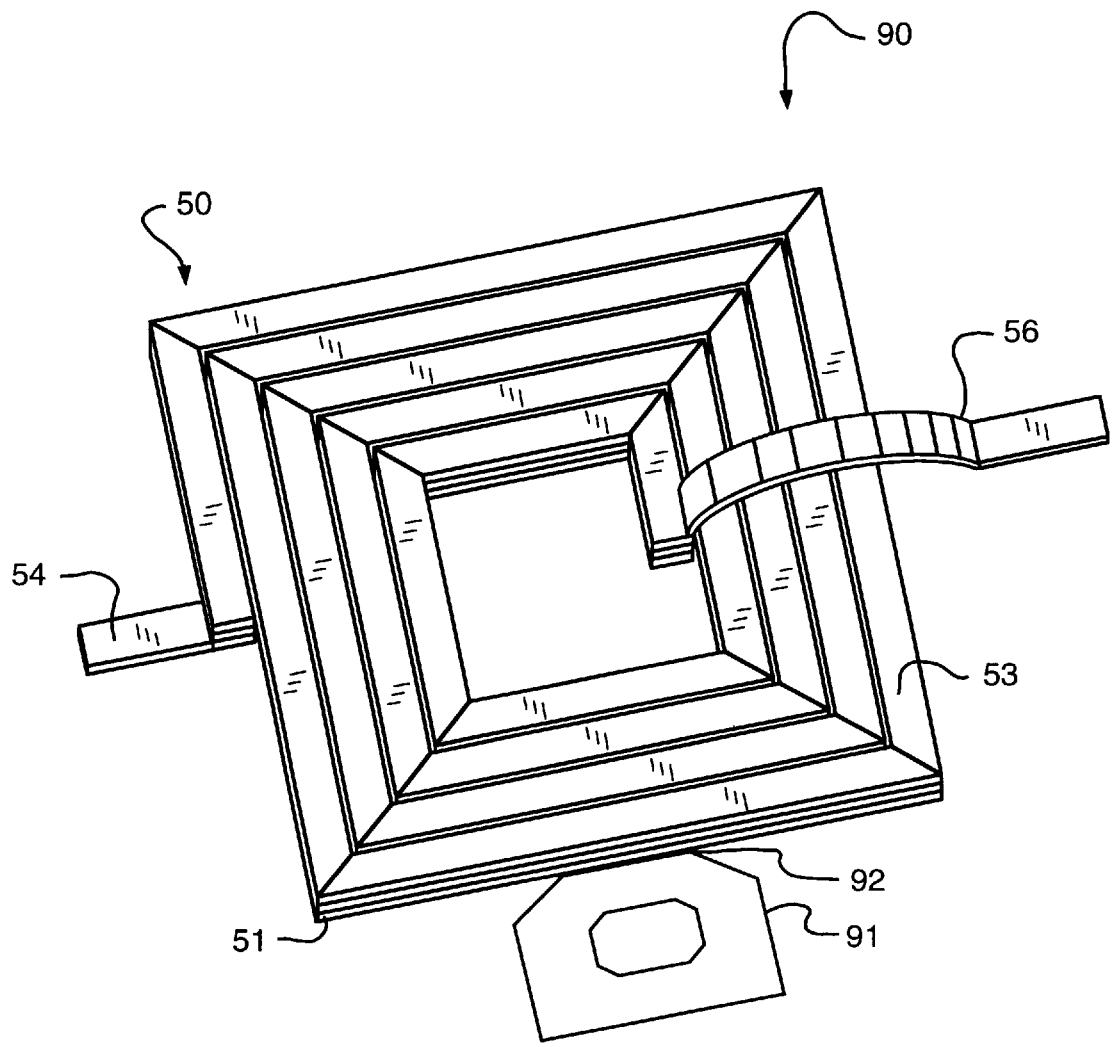
FIG. 4 is a top perspective view of the physical layout of yet another embodiment of the present invention.

FIG. 4 is a top perspective view of another circuit 90 in accordance with the present invention in which one 51 of the two conductors 51, 53 is connected to at least one other circuit element, such as a ground via hole 91. Of course, the relative size and shape of ground via hole 91 shown in FIG. 4 are merely exemplary, and may be varied, depending upon the characteristics desired. Advantageously, as will be explained more fully in connection with FIG. 5, plate 91 may be connected to conductor 51 at a predetermined point 92 thereon to permit biasing of device 90 and/or an external device (not shown).

Figure 5:
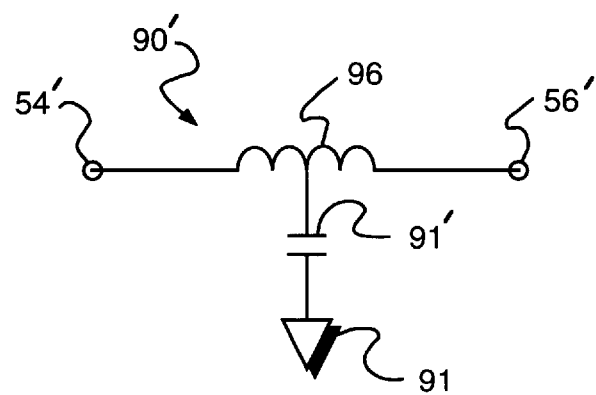
FIG. 5 is a schematic diagram of the equivalent circuit of embodiment depicted in FIG. 4.

Referring now to FIG. 5 which is a schematic circuit diagram of the electrically equivalent circuit 90 depicted in FIG. 4, circuit 90' comprises a series inductor 96 and bias-injection capacitor 91' connected to inductor 96. As shown in FIG. 5, capacitor 91' may be connected to a ground pad 91. DC bias may be injected at either terminal 54' or terminal 56' with the bypass capacitance connected to ground at 91. Thus, advantageously, adjustment of the point 92 permits injection of desired biasing either to or from embodiment 90.

Figure 6:
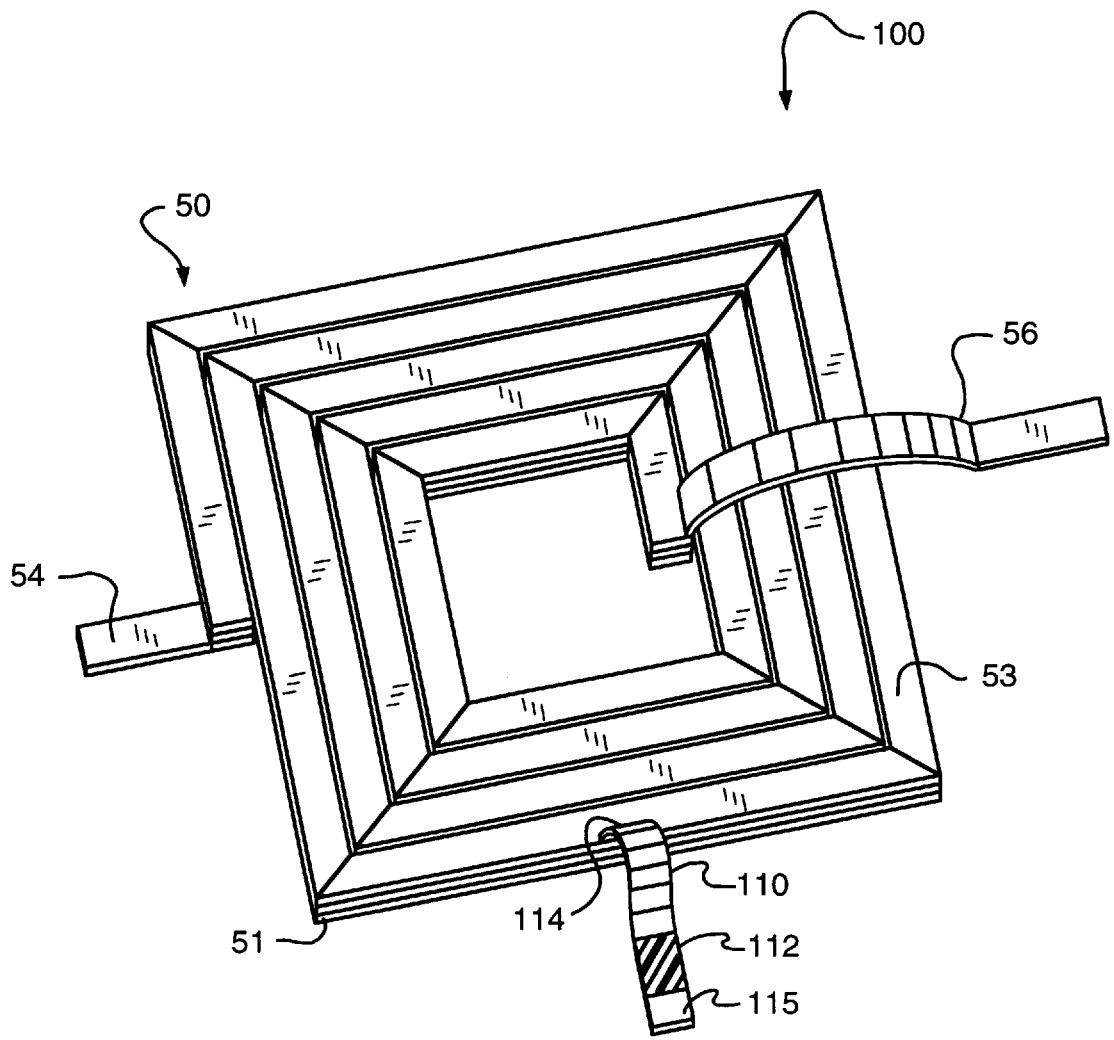
FIG. 6 is a top perspective view of the physical layout of a further embodiment of the present invention.

FIG. 6 illustrates, in top perspective view, yet still another and preferred embodiment of the present invention. The circuit 100 shown in FIG. 6 comprises circuit element 50 shown in FIG. 2 and resistive bias voltage injection means 110 connected between one conductive layer 53 of the two conductive layers 51, 53 of element 50 and an external biasing source (not shown). Means 110 preferably comprises a strip or length 112 of resistive material (for example, nichrome or tantalum nitride) connected between the conductive layer 53 and the external biasing source. The point 114 at which means 110 is connected to layer 53 of element 50 is chosen to permit predetermined biasing of an external network (not shown) and/or element 50. As shown in FIG. 6, if means 110 is connected to the one conductive layer 53 of element 50, conventional air bridge technology may be used to construct means 110 to prevent short-circuiting of means 110 to any other portion of the circuit 100. Alternatively, means 110 may be connected to the bottom 51 layer of embodiment 50. Circuit 100 also includes external network connector pad 115.

Figure 7:
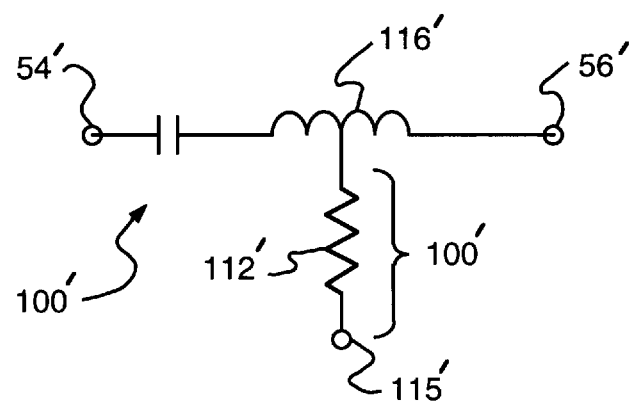
FIG. 7 is a schematic diagram of the equivalent circuit the embodiment depicted in FIG. 6.

Referring to FIG. 7 which is a schematic diagram of the electrically equivalent circuit 100' of circuit 100 shown in FIG. 6, equivalent circuit 100' comprises biasing means 110' comprising resistor 112' connected between inductor 116' and external network connector 115' so as to permit desired biasing injection to inductor 116'.

The novel circuit element of the present invention may be formed using conventional process steps and fabrication techniques. For example, the circuit element of the present invention may be formed using photolithography, etching, deposition, packaging techniques and/or other processing steps taken from conventional metal-insulator-metal capacitor fabrication technology and/or other integrated circuit fabrication technology.

To further illustrate the advantages of the present invention, reference is made to the following example:

EXAMPLE

Figure 1:
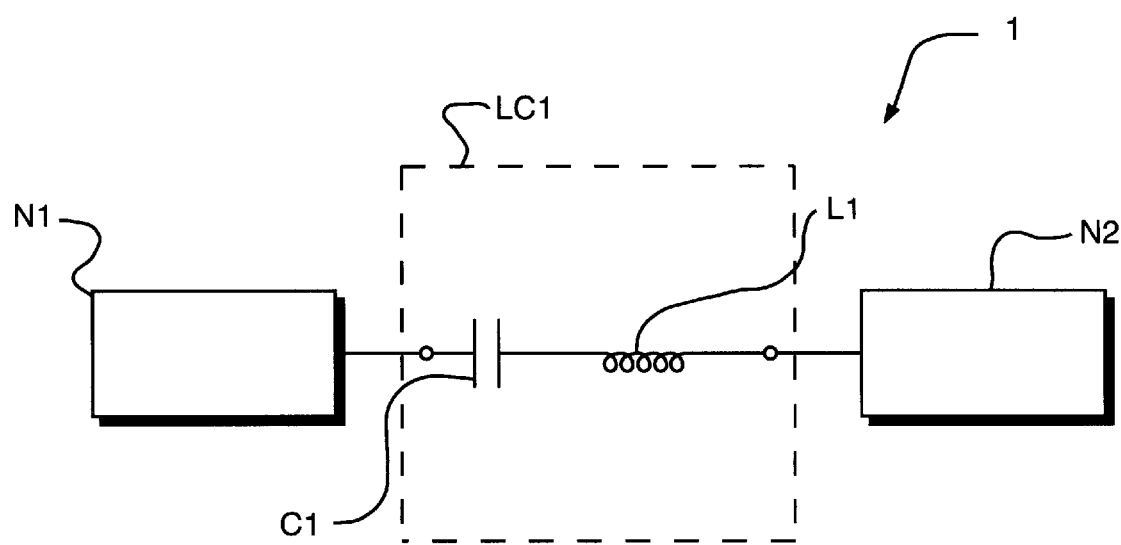
FIG. 1 is a schematic diagram showing two networks connected together by a series-connected inductor-capacitor network in accordance with the prior art.

A circuit element 50 was manufactured as shown in FIG. 2. The element consumed a surface area of about $1.37 \times 10^{-7}$ square meters, and exhibited the characteristics of a 50 picofarad capacitor connected in series to a 5 nano Henry inductor. By comparison, a conventional series-connected capacitor and inductor network made according to the prior art, i.e. as illustrated in FIG. 1, and exhibiting these same characteristics consumes about $2.63 \times 10^{-7}$ square meters. Thus, the circuit element of the present invention is able to exhibit the electrical characteristics of a conventional series-connected capacitor-inductor network, while consuming only about 52 percent of the surface area as would be required by a conventional. network.

Figure 8:
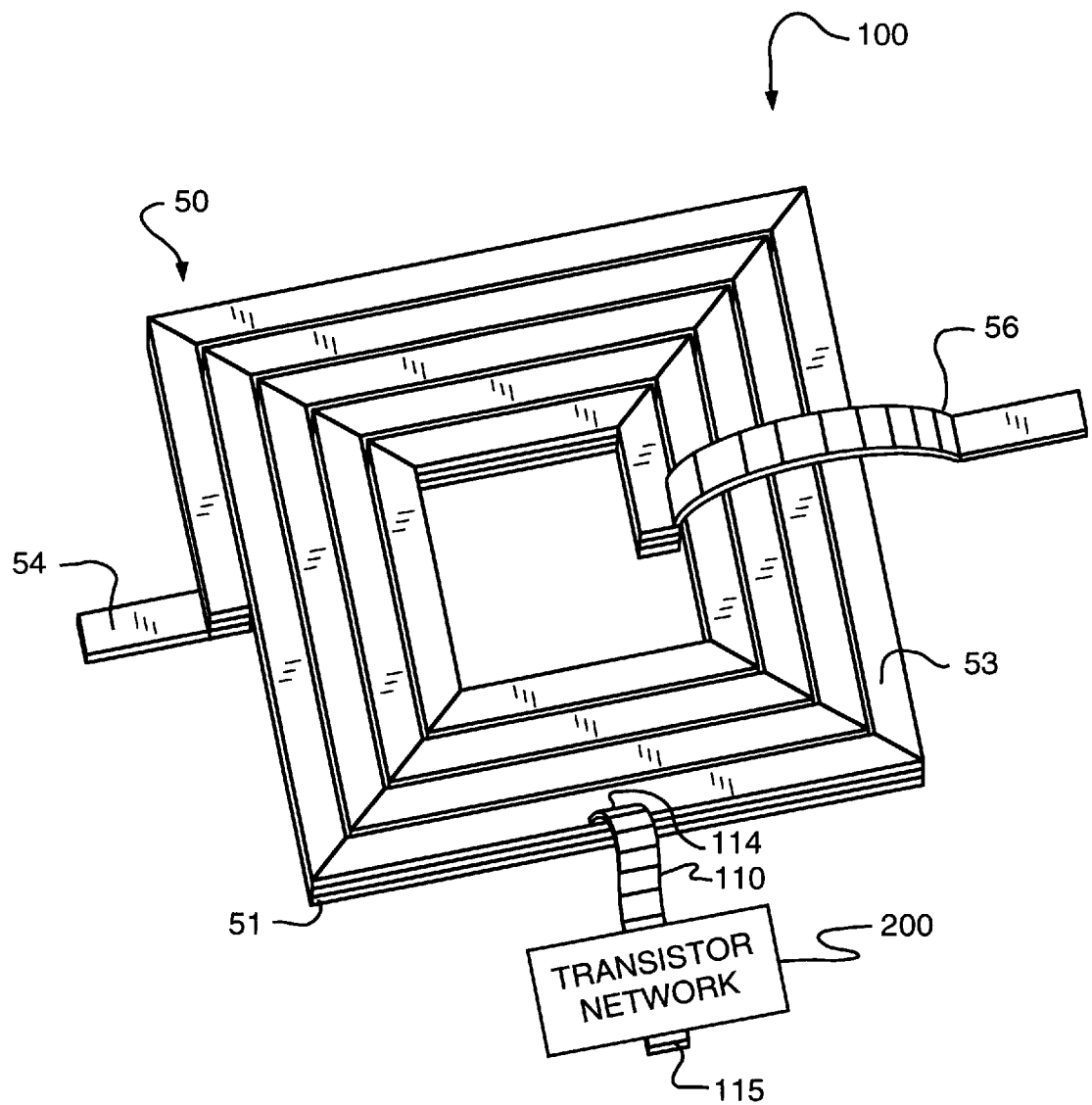
FIG. 8 is a top perspective of the layout of a variation of the embodiment of the present invention shown in FIG. 6, in which variation, a transistor or a transistor-based network (shown in block form) is substituted for the resistor biasing element of the embodiment of FIG. 6.
Figure 9:
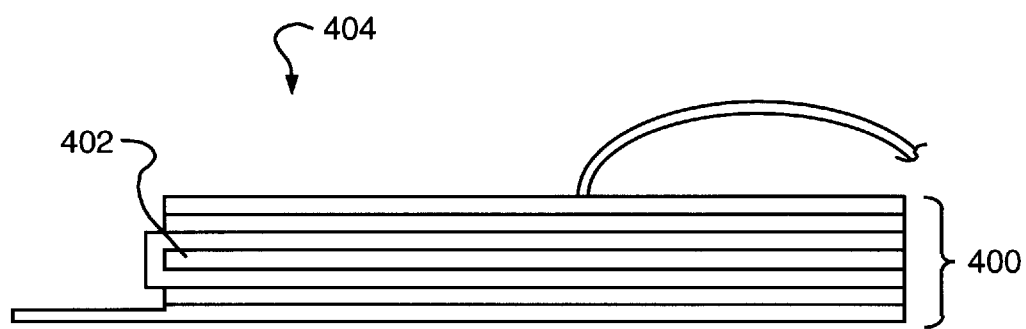
FIG. 9 is a simplified side view of the physical layout of a further embodiment of the present invention in which a plurality of circuit elements according to the present invention are separated from each other.
Figure 10:
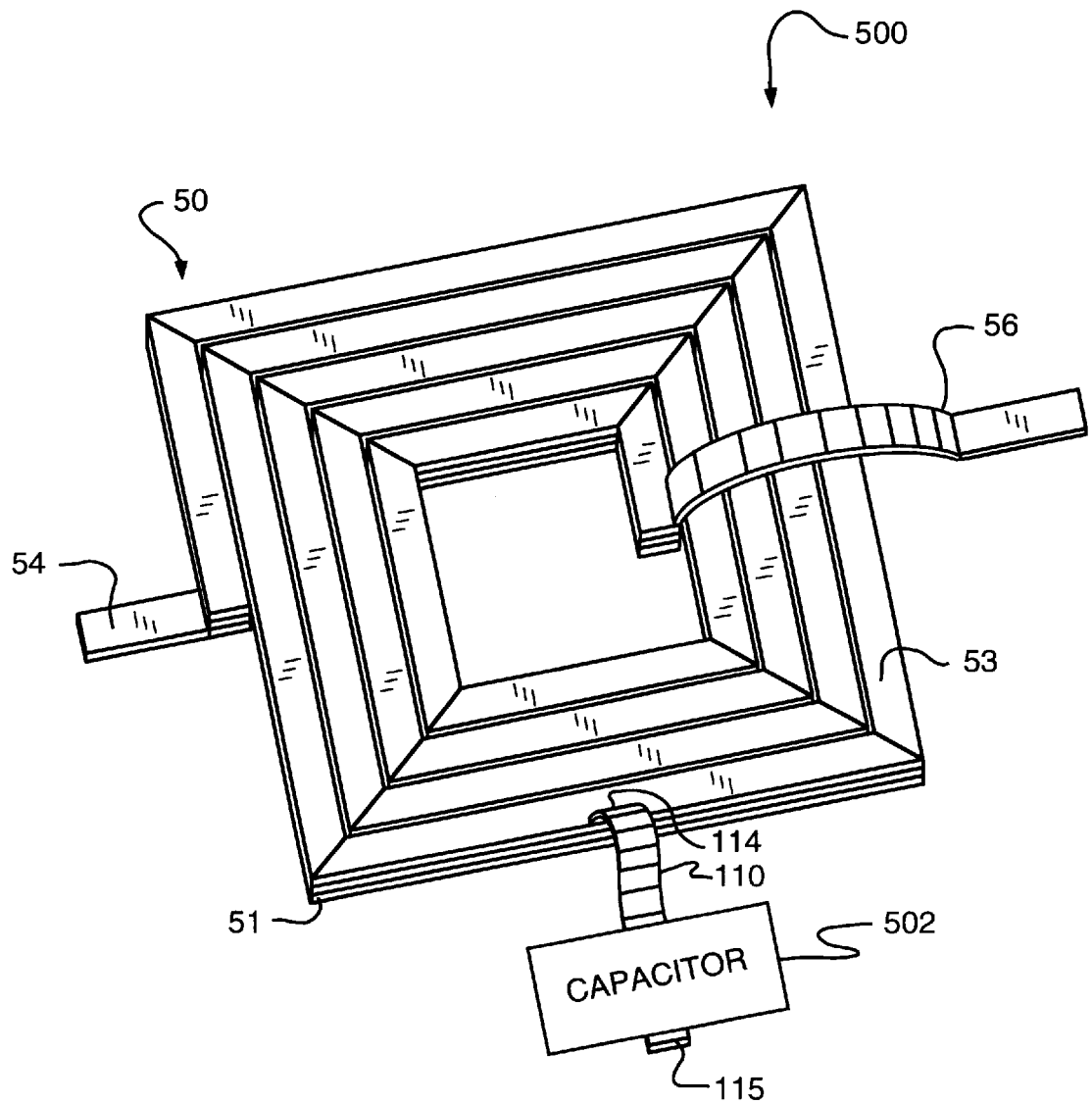
FIG. 10 is a top perspective view of the layout of another variation of the embodiment of FIG. 6, in which variation a conventional parallel-plate capacitor (shown in block form) is substituted for the resistor biasing element of FIG. 6.

Thus, it is evident that there has been provided, in accordance with the present invention, a novel circuit element which fully satisfies both the aims and objects hereinbefore set forth. While the present invention has been described in conjunction with specific embodiments thereof, various changes may be made without departing from the spirit and scope of the of the invention. For example, as an alternative to the resistor biasing element 112 as shown in block diagram form in FIG. 8 of biasing means 110, a transistor 200 or transistor-based network may be substituted for resistor 112. Advantageously, such an alternative configuration permits active biasing of circuit 50 and/or the transistor network. Other modifications are also possible without departing from the present invention. For example, a plurality of circuit elements 400 according to the present invention may be stacked upon each other and separated from each other at least partially by additional respective layers of insulative material 402, whereby e.g., to form a network 404 of circuit elements according to the present invention as shown in FIG. 9. Additional changes are also possible. For example, a further variation of the embodiment of FIG. 6 is shown in FIG. 10. In embodiment 500 shown in FIG. 10, the resistor biasing element 112 of embodiment 100 is replaced with a conventional parallel-plate capacitor 502. Further modifications are also possible without departing from the present invention. Accordingly, the present invention is intended to embrace all such alternatives, modifications, and variations as may fall within the spirit and broad scope of the hereinafter appended claims.

What is claimed is:

1. A circuit element having a surface area M, and comprising:
   a. a first coiled-layer of conductive material;
   b. a layer of dielectric material disposed upon said first conductive layer; and
   c. a second coiled-layer of conductive material disposed upon said layer of dielectric material, said layer of dielectric material physically separating and isolating said first coiled-layer from said second coiled-layer such that said first coiled-layer is physically unconnected to said second coiled-layer and also such that interaction between said first coiled-layer and second coiled-layer is substantially only electromagnetic in nature;

said element exhibiting electrical impedance characteristics comparable to electrical impedance characteristics exhibited by a conventional parallel-plate capacitor connected in series to a spiral inductor network having a surface area substantially equal to 2M.

2. An element according to claim 1, wherein said first coiled-layer has a number of turns which are different from a number of turns of said second coiled-layer.

3. An element according to claim 1, wherein said first coiled-layer has turns equal in number to the number of turns of said second coiled-layer.

4. An element according to claim 1, wherein said first and second coiled-layers are centered about a common imaginary axis running vertically through respective centers of said coiled layers.

5. An element according to claim 1, wherein said first and second coiled-layers are centered about non-coinciding respective imaginary axes running vertically through respective centers of said coiled-layers.

6. An element according to claim 1, wherein at least one of said coiled-layers has between 2.5 and 6.5 turns.

7. An element according to claim 1, having two or more terminals connected to said coiled-layers.

8. An element according to claim 1, wherein said dielectric layer comprises at least one material selected from the group consisting of silicon nitride, silicon dioxide, and a polyimide.

9. An element according to claim 1, wherein said dielectric layer comprises silicon nitride.

10. An element according to claim 1, wherein said first and second coiled-layers respectively have different coil dimensions.

11. An element according to claim 1, wherein said first and second coiled-layers respectively have similar coil dimensions.

12. An element according to claim 1, wherein said first and second coiled-layers are respectively comprised of different conductive materials.

13. An element according to claim 1, wherein said first and second coiled-layers are respective comprised of the same conductive material.

14. An element according to claim 1, wherein at least one of said first and second coiled-layers comprises at least one material selected from the group consisting of gold, aluminum and silver.

15. A circuit element, and comprising:
   a. a first coiled-layer of a first conductive material having a first number of turns;
   b. a layer of dielectric material disposed upon said first coiled-layer;
   c. a second coiled-layer of a second conductive material disposed upon said layer of dielectric material and having a second number of turns, said dielectric layer physically separating and isolating said coiled-layers such that said coiled-layers are physically unconnected to one another and also such that interaction between said coiled-layers is substantially only electromagnetic in nature;

said element having a surface area equal to M and exhibiting electrical impedance characteristics comparable to electrical impedance characteristics exhibited by a conventional parallel-plate capacitor connected in series to a spiral network having a surface area about equal to 2M.

16. An element according to claim 15, wherein said first and second conductive materials are different from each other.

17. An element according to claim 15, wherein said dielectric material comprises at least one material selected from the group consisting of silicon nitride, silicon dioxide, and a polyimide.

18. An element according to claim 15, wherein said dielectric layer comprises silicon nitride.

19. An element according to claim 15, wherein at least one of said first and second conductive materials comprises at least one material selected from the group consisting of gold, aluminum and silver.

20. An element according to claim 15, wherein said first and second coiled-layers respectively have different coil dimensions.

21. An element according to claim 15, wherein said first and second coiled layers respectively have similar coil dimensions.

22. An element according to claim 15, wherein said first and second number of turns are different.

23. An element according to claim 15, wherein said first and second number of turns are equal to each other.

24. An element according to claim 15, wherein said first and second coiled-layers are centered about a common imaginary axis running vertically through respective centers of said coiled-layers.

25. An element according to claim 15, wherein said first and second coiled-layers are centered about non-coinciding imaginary axes running vertically through respective centers of said coiled-layers.

26. An element according to claim 15, wherein said numbers of turns are between 2.5 and 6.5 turns.

27. An element according to claim 15, having two or more terminals connected to said coiled-layers.

28. An element according to claim 15, wherein said first and second conductive materials are the same.

29. An electronic device, and comprising:
  a. at least one circuit element including a first coiled-layer of conductive material, a layer of dielectric material disposed upon said first conductive layer, a second coiled-layer of conductive material disposed upon said layer of dielectric material, wherein said first and second coiled-layers are physically completely separated and isolated from each other by the dielectric material such that said coiled-layers are totally unconnected to each other through and adjacent said dielectric layer and also such that interaction between said coiled-layers is substantially only electromagnetic in nature, said element has a surface area equal to M and exhibits electrical impedance characteristics comparable to electrical impedance characteristics exhibited by a conventional parallel-plate capacitor connected in series to a spiral inductor network having a surface area about equal to 2M; and
  b. at least one other circuit element connected to one of said two coiled-layers at a predetermined place thereon whereby to provide a desired bias level to said one circuit element when a biasing source is connected to said other circuit element.

30. A device according to claim 29, wherein said at least one other circuit element comprises a transistor.

31. A device according to claim 29, wherein said at least one other circuit element comprises a resistive element.

32. A device according to claim 29, wherein said at least one other circuit element comprises a capacitor.

33. A circuit network comprising a plurality of circuit elements, each circuit element including
  a first coiled-layer of conductive material, a layer of dielectric material disposed upon said first conductive layer, a second coiled-layer of conductive material disposed upon said layer of dielectric material, wherein said first and second coiled-layers are physically separated and isolated from each other by the dielectric material such that said first and second coiled-layers are totally unconnected to each other through and adjacent said dielectric layer and also such that interaction between said first and second coiled-layers is substantially only electromagnetic in nature, said element has a surface area equal to M and exhibits electrical impedance characteristics comparable to electrical impedance characteristics exhibited by a conventional parallel-plate capacitor connected in series to a spiral inductor network having a surface area about equal to 2M, said circuit elements being at least partially separated from each other by respective additional layers of insulating material.

34. A circuit network comprising a plurality of circuit elements, each said circuit element including a first coiled-layer of conductive material, a layer of dielectric material disposed upon said first conductive layer, a second coiled-layer of conductive material disposed upon said layer of dielectric material, said first and second coiled-layers being physically separated and isolated from each other by the dielectric material such that said first and second coiled-layers are totally unconnected to each other and also such that interaction between said first and second coiled-layers is substantially only electromagnetic in nature, and said element has a surface area equal to M and exhibits electrical impedance characteristics comparable to electrical impedance characteristics exhibited by a conventional paralle-plate capacitor connected in series to a spiral inductor network having a surface area about equal to 2M, said circuit elements being at least partially separated from each other by respective additional layers of insulating material.

* * * * *